United States Patent
Farrow

[11] 3,992,233
[45] Nov. 16, 1976

[54] SURFACE TREATMENT OF 111-V COMPOUND CRYSTALS

[75] Inventor: Robin Frederick Charles Farrow, Malvern, England

[73] Assignee: The Secretary of State for Defence in Her Britannic Majesty's Government of the United Kingdom of Great Britain and Northern Ireland, London, England

[22] Filed: May 19, 1975

[21] Appl. No.: 578,976

[30] Foreign Application Priority Data
Mar. 10, 1975 United Kingdom............. 9921/75

[52] U.S. Cl. ................. 148/175; 29/572; 136/89; 156/612; 357/16; 357/30; 427/87; 427/314
[51] Int. Cl.² ............... H01L 21/203; H01L 31/00
[58] Field of Search .............. 148/175; 156/612; 357/16, 17, 30; 136/89; 29/572; 427/87, 314

[56] References Cited
UNITED STATES PATENTS

| | | |
|---|---|---|
| 2,938,816 | 5/1960 | Günther ............... 148/175 UX |
| 3,631,303 | 12/1971 | Antypas ............... 357/30 |
| 3,632,442 | 1/1972 | Turnbull ............... 357/30 X |
| 3,666,553 | 5/1972 | Arthur et al. ............... 148/175 UX |
| 3,672,992 | 6/1972 | Schaefer ............... 357/30 X |
| 3,751,310 | 8/1973 | Cho ............... 148/175 |
| 3,755,002 | 8/1973 | Hirai et al. ............... 148/175 X |
| 3,915,765 | 10/1975 | Cho et al. ............... 148/175 |

OTHER PUBLICATIONS

Cho, A. Y., "Morphology of Epitaxial Growth of GaAs – – –Structures" J. Applied Physics, vol. 41, No. 7, June 1970, pp. 2780–2786.
Cho et al., "Molecular Beam Epitaxy of GaAs, $Al_x$-$Ga_{1-x}As$ and GaP" 1970 Symposium on GaAs, paper No. 2, pp. 18–29.
Chang et al., "Fabrication for Multilayer Semiconductor Devices" I.B.M. Tech. Discl. Bull., vol. 15, No. 2, July 1972, pp. 365–366.
Thurmond, C. D., "Phase Equilibria in the GaAs – – – GaP Systems" J. Phys. Chem. Solids, vol. 26, 1965, pp. 785–802.

Primary Examiner—L. Dewayne Rutledge
Assistant Examiner—W. G. Saba
Attorney, Agent, or Firm—Pollock, VandeSande & Priddy

[57] ABSTRACT

Group III–V compound substrates are heat cleaned under vacuum conditions by heating above their congruent temperature and subjecting the substrate to at least one molecular beam of the material preferentially evaporating from the substrate thereby maintaining surface stoichiometry. Surfaces so cleaned may then have an epitaxial layer grown thereon under similiar conditions from molecular beams. Alternatively the cleaned surface may be coated with cesium and oxygen to form a photocathode.

9 Claims, 3 Drawing Figures

SURFACE TREATMENT OF III-V COMPOUND CRYSTALS

This invention relates to a method for the surface treatment of III-V compound crystals, in particular the cleaning of crystal substrate in preparation for subsequent growth of an epitaxial layer.

Group III-V compounds are frequently cut and polished to provide a flat surface on which epitaxial layers of a doped III-V compound are grown to form part of a field effect transistor (FET).

Alternatively a layer of cesium and oxygen are deposited to form part of a photo cathode. It is necessary to clean the substrate prior to growing or depositing the layer and such cleaning is commonly achieved by ion bombardment or heating to boil off surface impurities. Such ionic bombardment has attendant disadvantages since it introduces strains and damage to the substrate surface which then required annealing. Heating the substrate also introduces problems and improperly cleaned surfaces.

According to this invention a method of cleaning group III-V material substrates comprises the steps of heating the substrate above its congruent melting temperature in a vacuum while subjecting the substrate to at least one molecular beam of the material preferentially evaporating from the substrate whereby the substrate surface is maintained stoichiometric.

It has been found that if a III-V compound is heated above a certain limiting temperature (congruent temperature) in a vacuum a preferential evaporation of one of its constituents occurs. For example when InP is heated above a temperature of about 638° K, to clean a substrate, phosphorus molecules preferentially evaporate leaving the substrate surface non-stoichiometric and carrying small blobs of relatively pure indium. Such a surface degrades the performance of any device subsequently made using this surface.

In the case of InP it has been found that by impinging molecular beams of $P_2$ or $P_4$ onto the surface of a heated InP substrate the surface remains stoichiometric and free from concentration of In.

Similarly, for GaAs above about 893° K As is preferentially evaporated off a substrate. By impinging a molecular beam of $As_4$ on the heated substrate a stoichiometric surface is maintained during cleaning.

A clean stoichiometric surface is ideal for subsequent deposition of e.g. a doped epitaxial layer.

Various group III-V compounds may be treated by the method of this invention, e.g. InP, InAs, InSb, GaSb, GaP, GaAs and also mixed III-V compounds e.g. $InAs_xP_{1-x}$, $Ga_xIn_{1-x}As_yP_{1-y}$, $Ga_xIn_{1-x}P$, $Ga_xIn_{1-x}As$.

The invention will now be described with reference to the accompanying drawings of which:

Figure 1:
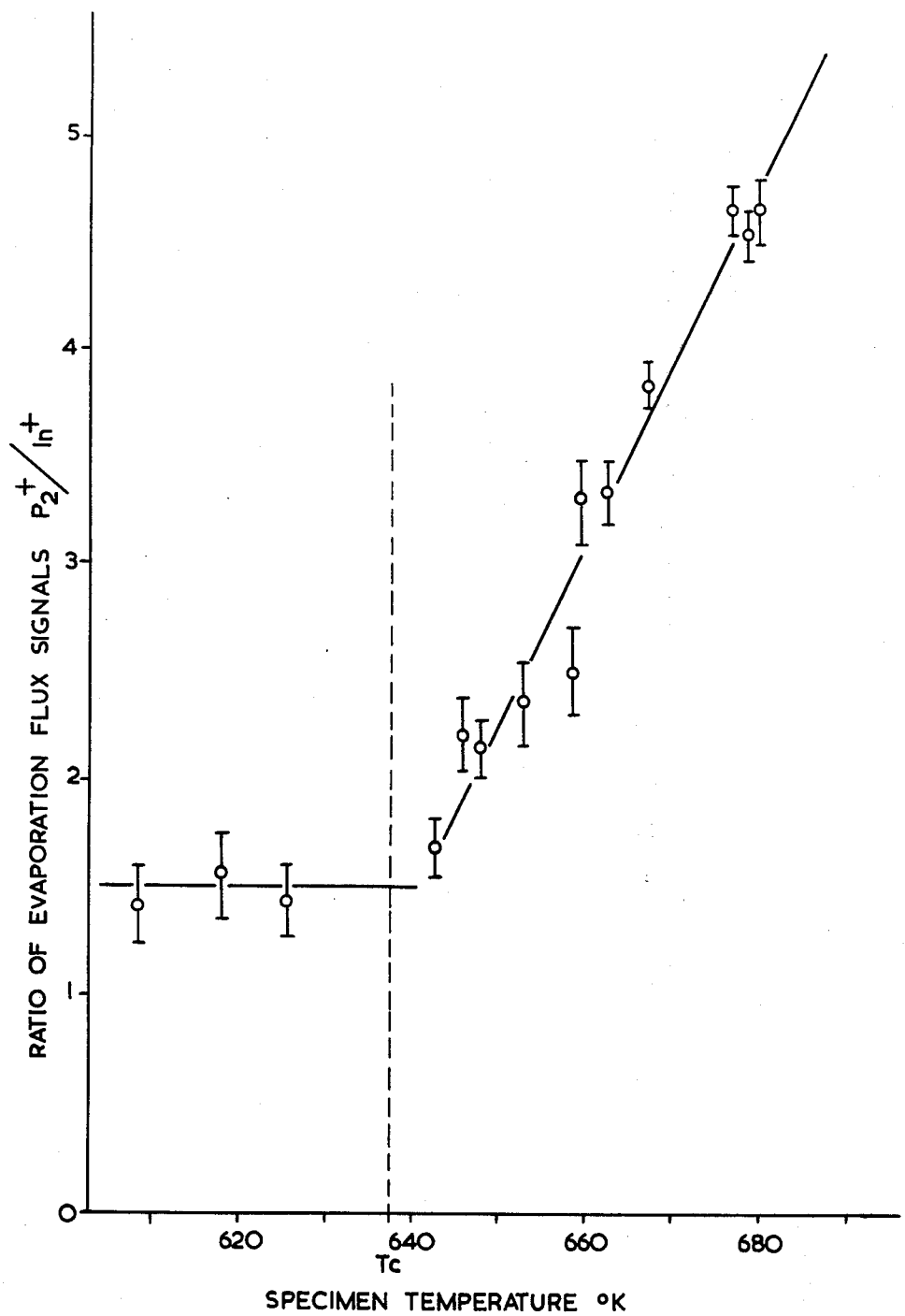
FIG. 1 is a stylized graph showing ratio of $P_2$:In evaporation against temperature.

As seen in FIG. 1 the ratio of phosphorus loss to indium loss remains reasonably constant for temperatures up to about 638° K. Further increases in temperature result in large phosphorus losses. The temperature at which the graph changes shape is termed the congruent temperature $T_c$ and varies with material.

Heating of a substrate, as already noted, is one way of cleaning a substrate of impurities such as oxygen. It is observed that residual oxygen present as a surface impurity may remain bonded to the InP surface at temperatures up to about 723° K. Thus prior art temperature cleaning (at $\simeq$ 638° K) resulted in excess indium on a substrate surface.

Figure 2:
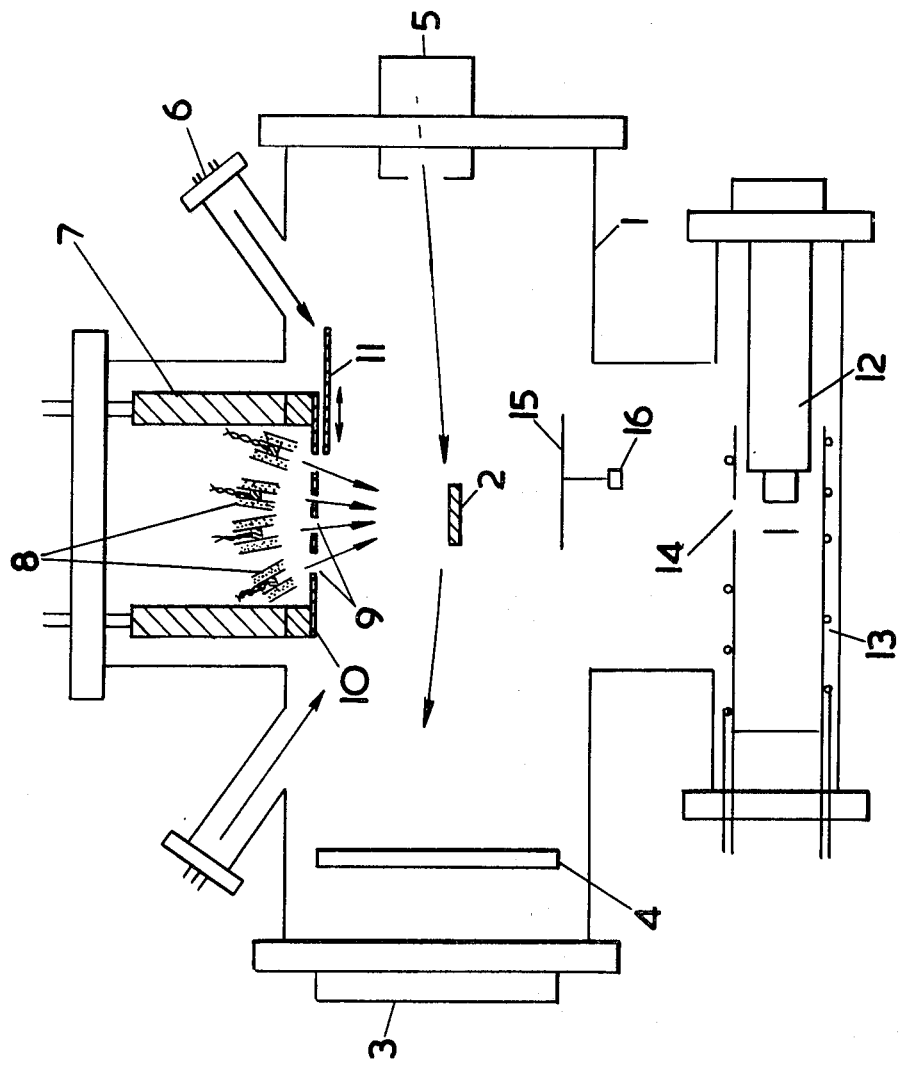
FIG. 2 is a diagram of apparatus for carrying out the method of this invention.

FIG. 2 shows apparatus for controlling the conditions of a substrate surface during cleaning and for subsequent epitaxial growth. It comprises a pressure tight chamber 1 which in operation is evacuated to about $10^{-9}$ Torr. A substrate 2 is positioned within the chamber 1 on suitable supports (not shown). Radiant electric heaters are arranged to heat the substrate 2. Observation of the substrate structure is through a window 3 on a viewing screen 4 which receives electrons from an electron gun 5 after deflection from the substrate 2. Impurities in the substrate 2 are determined by analyzing the energy of electrons fired from an Auger gun 6 on to the substrate 2. Above the substrate 2 and within a liquid nitrogen shield 7 are molecular beam ovens 8 each arranged in alignment with an aperture 9 in a wall 10. A shutter 11 is movable across the wall 10 to selectively cover the apertures 9.

The ovens 8 may be Knudson effusion ovens each comprising an electrically heated tube containing a source material, In, or InP, or P of a doped III-V compound. Temperature of the ovens is monitored by thermocouples and controlled by varying the temperature to control the evaporation of the source material and hence molecular beam density. Beneath the substrate 2 is a quadrupole mass spectrometer 12 contained within a liquid nitrogen shield 13 provided with an aperture 14 through which molecules of e.g. $P_2$ may enter from the ovens 8. A chopper 15 rotated by an electric motor 16 chops radiation from the ovens 8 onto the spectrometer 12.

A chromium doped InP substrate crystal may be cleaned and an epitaxial layer of tin doped InP grown as follows. The substrate 2 is placed in the chamber 1 which is then evacuated to about $10^{-9}$ Torr. and its temperature raised to about 638° K. The oven 8 containing InP, or P is heated until $P_2$ or $P_4$ emerges to be sensed by the spectrometer 12. The substrate 2 temperature is then raised to about 773° K at which temperature much more phosphorus is given off the substrate 2 than indium. However, the stream of phosphorus molecules impinging on the substrate 2 combines with the indium molecules to maintain stoichiometry at the surface. Thus In and P bonds at the surface are continually being broken and remade while impurities, oxides, are evaporated off. This is continued for up to one hour.

To deposit a doped epitaxial layer, e.g. Sn doped InP, the shutter 11 is adjusted to allow molecular beams from three ovens 8 one containing InP, to give a $P_2$ beam, and one containing In, and the other containing the dopant Sn, to strike the substrate and build up a layer of n-type doped InP. After the appropriate thickness has been laid down, typically 1,000A thick, the shutter 11 is moved to close all the apertures 9 and the chamber 1 allowed to cool.

Other dopants may be used to give an n-type epitaxial InP layer typically 0.5 μm thick of carrier concentration around $10^{17}$ per cc. Such arrangements may be used in F.E.T. devices.

For a Gunn type device the substrate may be a Sn doped InP with an n-type InP 10 μm thick epitaxial layer of carrier concentration $10^{13}$ to $10^6$ per cc.

A photocathode may be prepared by the method of this invention. A GaAs substrate is placed in the chamber 1 which is then evacuated to about $10^{-9}$ Torr. and heated to about 893° K. Above this temperature As evaporates preferentially leaving a Ga rich surface. To avoid this at a high cleaning temperature e.g. 973° K a molecular beam of $As_2$ or $As_4$ is beamed from one of the ovens 8. Thus a stoichiometric surface is maintained. After a sufficient time e.g. 0.5 hour, at 973° K the surface is clean, most of the impurities e.g. oxides, having evaporated, and the substrate may be allowed to cool to between 290°–325° K and is then coated with alternate monolayers of cesium and oxygen e.g. about three or four layers of each. This is achieved by heating cesium chromate or atomic cesium in a Knudson oven 8 to obtain a molecular beam of cesium; the oxygen layer is obtained by admitting gaseous oxygen into the chamber 1.

Figure 3:
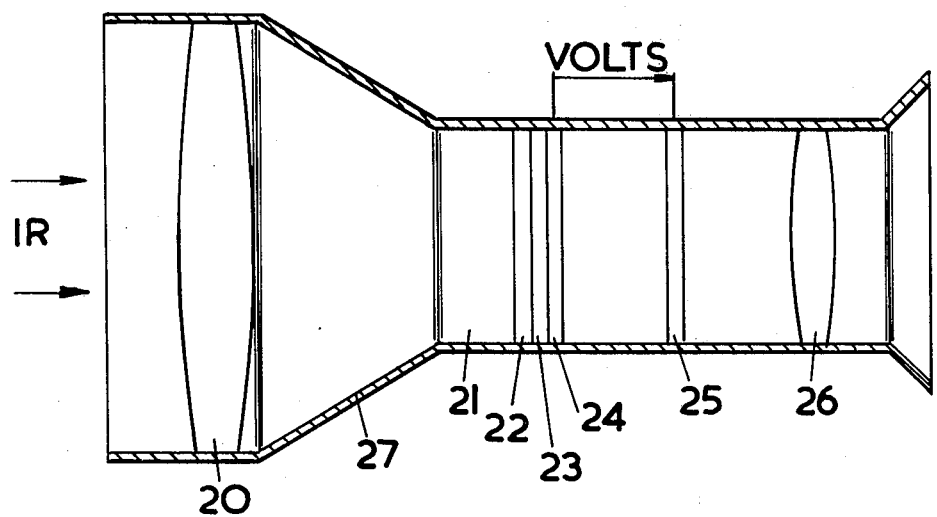
FIG. 3 is a diagrammatic view of a photocathode viewer.

FIG. 3 shows an example of a night vision device which utilizes infra red radiation to provide an observable scene on a screen. It comprises focussing lens 20 spaced from a GaP window 21 typically 0.4mm thick and 20mm diameter. On one surface of the window 21 is grown a P-type GaAlAs layer 22 about 20 μm thick by liquid phase epitaxy. On the GaAlAs layer 22 a 1–3 μm thick p+ type GaAs layer 23 is grown by liquid phase epitaxy. The surface of the GaAs layer 23 is then cleaned as described above and thin Cs, O layers 24 grown. Spaced about 1mm from the Cs, O layer 24 is a phosphor layer 25 and spaced from this is an eye piece 26 all enclosed in an evacuated tubular casing 27. An electric field is maintained between the Cs, O layer 24 and the phosphor layer 25.

Alternate materials may be used for the window 21 and active layer 23. For example the window 21 may be GaAs with a $Ga_xIn_{1-x}As$ layer 23 grown direct on the window; the window may be InP with a layer 23 of $Ga_xIn_{1-x}As$ or $InAs_{1-x}P_x$ or $Ga_xIn_{1-x}As_yP_{1-y}$ grown direct on the window 21.

In operation IR radiation from a scene is focussed onto the window 21. Photons pass through the window 21 onto the GaAs layer 23 and cause the Cs, O layer 24 to emit an electron which is accelerated by the electric field to impinge on the phosphor layer 25 causing a visible spot on this phosphor layer. In this way the whole scene focussed onto the window 21 is visible to an observer through the eyepiece 26. In a modification an electron amplifier stage may be incorporated between the CS, O layer 24 and the phosphor layer 25 to intensify the observed image.

In one example InP was treated by exposing a surface to a molecular beam of phosphorus with the following arrival rate:

$P_4$ $5 \cdot 10^{12} cm^{-2} \cdot sec^{-1}$ and heating the InP crystal to 723° K for one hour. The free evaporation rates were $P_2$ $6 \cdot 10^{11} cm^{-2} \cdot sec^{-1}$ In $1.7 \cdot 10^{11} cm^{-2} \cdot sec^{-1}$ In another example InP was heated by exposing a surface to molecular beams with the following arrival rates:

$P_2$ $1.5 \times 10^{13} cm^{-2} \cdot sec^{-1}$ $P_4$ $5 \times 10^{12} cm^{-2} \cdot sec^{-1}$ In $3.2 \times 10^{11} cm^{-2} \cdot sec^{-1}$ and heating the InP crystal to 723° K for one hour. The free evaporation rates were $P_2$ $6 \cdot 10^{11} cm^{-2} \cdot sec^{-1}$ In $1.7 \times 10^{11} cm^{-2} \cdot sec^{-1}$ In both examples the final surface remained stoichiometric and free from concentration of In.

I claim:

1. A method of surface treating a group III–V compound material substrate comprising the step of cleaning the substrate by heating said substrate to a temperature above its congruent melting temperature in a vacuum thereby to preferentially evaporate one of the constituent materials of said substrate, and, simultaneous with said heating step, subjecting the substrate to at least one molecular beam of the constituent material which is preferentially evaporating from said substrate thereby to maintain the substrate surface substantially stoichiometric.

2. The method of claim 1 including the further step of growing an epitaxial layer on said substrate by exposing the substrate surface to molecular beams of the material comprised in the epitaxial layer to be grown thereon, said further step being conducted under vacuum conditions subsequent to said cleaning step and while maintaining the temperature of said substrate above its said congruent temperature.

3. The method of claim 1 including the step of cooling said substrate under vacuum conditions following said cleaning step, and thereafter depositing alternate layers of cesium and oxygen onto the surface of said substrate thereby to produce a photocathode.

4. The method of claim 2 wherein said substrate comprises chrome doped InP the congruent temperature of which is 630° K, said further step being operative to grow an epitaxial layer of n-type InP on said substrate.

5. The method of claim 2 wherein said substrate comprises n-type InP of carrier concentration $10^{17}$ per cc the congruent temperature of which is 630° K, said further step being operative to grow an epitaxial layer of n-type InP of carrier concentration $10^{13}$ to $10^{16}$ per cc on said substrate.

6. The method of claim 3 wherein said photocathode comprises a gallium phosphide window, said method including the steps of coating one side of said window with a layer of p-type gallium aluminum arsenide, a layer of p+-type gallium arsenide, and said alternate layers of cesium and oxygen.

7. The method of claim 3 wherein said photocathode comprises an InP window, said method including the steps of coating said window with a layer of $InAs_{1-x}P_x$ and with said alternate layers of cesium and oxygen.

8. The method of claim 3 wherein said photocathode comprises an InP window, said method including the steps of coating said window with a layer of $Ga_xIn_{1-x}As_yP_{1-y}$ and with said alternate layers of cesium and oxygen.

9. The method of claim 3 wherein said photocathode comprises an InP window, said method including the steps of coating said window with a layer of $Ga_xIn_{1-x}As$ and with said alternate layers of cesium and oxygen.

* * * * *